(12) United States Patent
Aldereguia et al.

(10) Patent No.: US 9,279,844 B2
(45) Date of Patent: Mar. 8, 2016

(54) CABLE DETECTION IN A PIN CONSTRAINED CONNECTOR

(71) Applicant: International Business Machines Corporation, Armonk, NY (US)

(72) Inventors: Alfredo Aldereguia, Cary, NC (US); Jeffrey R. Hamilton, Pittsboro, NC (US); Clifton E. Kerr, Durham, NC (US); Grace A. Richter, Raleigh, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 227 days.

(21) Appl. No.: 14/048,175

(22) Filed: Oct. 8, 2013

(65) Prior Publication Data

US 2015/0097550 A1    Apr. 9, 2015

Related U.S. Application Data

(63) Continuation of application No. 14/047,660, filed on Oct. 7, 2013.

(51) Int. Cl.
  *G01R 19/00* (2006.01)
  *G01R 29/00* (2006.01)
  (Continued)

(52) U.S. Cl.
  CPC ............ *G01R 29/00* (2013.01); *G01R 31/04* (2013.01); *G01R 31/043* (2013.01); *H01R 13/465* (2013.01); *H01R 13/641* (2013.01); *H04L 29/06* (2013.01); *H04L 69/08* (2013.01)

(58) Field of Classification Search
  CPC ...... G01R 31/04; G01R 29/00; G01R 31/043; G01R 29/06; H04L 69/08; H01R 13/465; H01R 13/641
  See application file for complete search history.

(56) References Cited

U.S. PATENT DOCUMENTS

| | | |
|---|---|---|
| 7,475,178 B2 | 1/2009 | Rubin et al. |
| 7,746,081 B2 | 6/2010 | Slaton |

(Continued)

FOREIGN PATENT DOCUMENTS

| | | |
|---|---|---|
| JP | 200839532 A | 2/2008 |
| JP | 2009124347 A | 4/2009 |

OTHER PUBLICATIONS

Lo, Chet et al. "Noise-Domain Reflectometry for Locating Wiring Faults", IEEE Transactions on Electromagnetic Compatibility, vol. 47, No. 1, Feb. 2005, 8 pages.

(Continued)

*Primary Examiner* — Son Le
(74) *Attorney, Agent, or Firm* — Katherine S. Brown; Jeffrey L. Streets

(57) ABSTRACT

A method of detecting a cable connected to a first device includes generating a second signal within the first device, and outputting the second signal onto an input-only pin of a cable connector on the first device, wherein the input-only pin is assigned to receive a first signal from a driver on a second device when a cable is connected from the second device to the cable connector, and wherein the second signal has a frequency that is at least four times greater than the frequency of the first signal. The method further comprises determining that a cable is not connected to the cable connector in response to detecting the second signal on a wire coupled to the input-only pin, and determining that the cable is connected to the cable connector in response to detecting a signal other than the second signal.

10 Claims, 3 Drawing Sheets

(51) Int. Cl.
*G01R 31/04* (2006.01)
*H01R 13/46* (2006.01)
*H04L 29/06* (2006.01)
*H01R 13/641* (2006.01)

(56) References Cited

U.S. PATENT DOCUMENTS

| | | |
|---|---|---|
| 7,902,810 B2 | 3/2011 | Naylor et al. |
| 7,915,898 B1 | 3/2011 | Kraemer |
| 2004/0249991 A1 | 12/2004 | Ali et al. |
| 2009/0167286 A1* | 7/2009 | Naylor et al. ............ 324/66 |
| 2012/0209988 A1* | 8/2012 | Pagan et al. ............ 709/224 |
| 2013/0049765 A1 | 2/2013 | Cheung et al. |

OTHER PUBLICATIONS

Tarasawa Koichi, "Cable Inspection Device" Hioki EE Corp, Patent Abstracts of Japan—Publ No. 2008-039532; Date of Publication: Feb. 21, 2008; 11 pages.

Tsuchiya Ken, "Detection Device, and Cable Connection Detection Method" Imagenics Co Ltd, Patent Abstracts of Japan—Publ No. 2009-124347; Date of Publication: Apr. 6, 2009; 14 pages.

\* cited by examiner

CABLE DETECTION IN A PIN CONSTRAINED CONNECTOR

CROSS-REFERENCE TO RELATED APPLICATIONS

This application is a continuation of U.S. patent application Ser. No. 14/047,660 filed on Oct. 7, 2013, which application is incorporated by reference herein.

BACKGROUND

1. Field of the Invention

The present invention relates to the detection of a cable connection between two electronic devices.

2. Background of the Related Art

Computers and other electronic devices may communicate using various communication protocols when connected by a cable. If an appropriate cable is not connected between two devices, then attempted communication will be unsuccessful. Furthermore, it may be desirable to automatically detect whether or not a cable connection has been made.

A cable detection circuit may utilize a resistor pull-up/pull-down circuit. A resistor pull-up/pull-down circuit makes use of a cable connector pin that is not assigned to any function. Accordingly, the resistor pull-up/pull-down circuit has full use of the pin and the associated conductor wire in the cable without concern for interference with other functions of that pin. Unfortunately, the ever-expanding features and capabilities of electronic devices have increased the demand for the pins, such that a pin having no other function is not always available.

BRIEF SUMMARY

Another embodiment of the present invention provides a method of detecting a cable connected to a first device. The method comprises generating a second signal within the first device, and outputting the second signal onto an input-only pin of a cable connector on the first device, wherein the input-only pin is assigned to receive a first signal from a driver on a second device when a cable is connected from the second device to the cable connector, and wherein the second signal has a frequency that is at least four times greater than the frequency of the first signal. The method further comprises determining that a cable is not connected to the cable connector in response to detecting the second signal on a wire coupled to the input-only pin, and determining that the cable is connected to the cable connector in response to detecting a signal other than the second signal.

DETAILED DESCRIPTION

Figure 1:
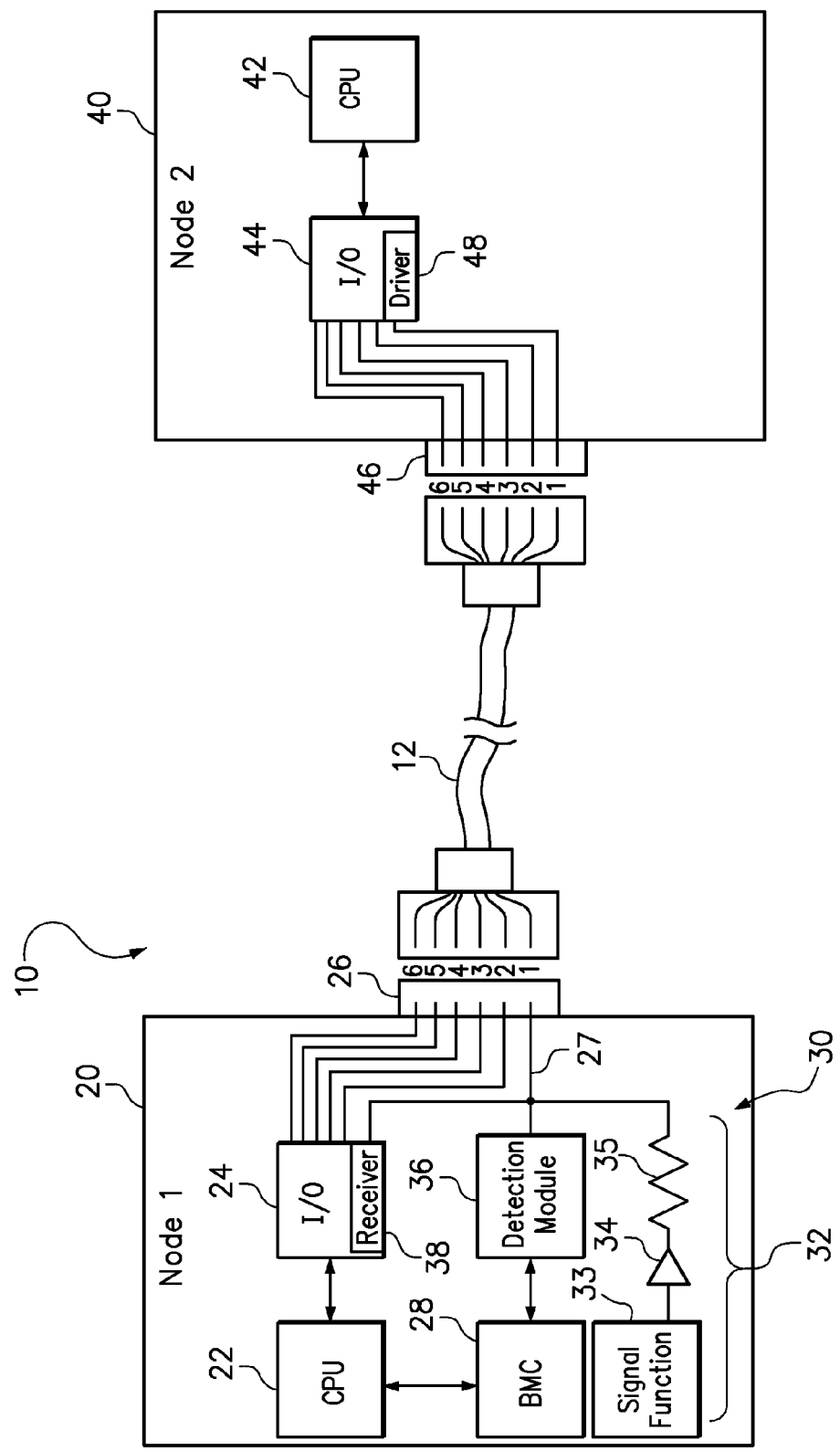
FIG. 1 is a diagram of a cable detection circuit prior to connecting a cable between two nodes.

One embodiment of the present invention provides a cable detection apparatus. The cable detection apparatus comprises a cable connector, a signal generator, and a detection module. The cable connector is located on a first device, wherein the cable connector has an input-only pin that is coupled to a receiver and assigned for receiving a first signal from a driver on a second device. The signal generator is located within the first device, wherein the signal generator has an output driving a second signal onto the input-only pin, and wherein the second signal has a frequency that is at least four times greater than the frequency of the first signal. Still further, the detection module has a detection input coupled to the input-only pin, wherein the detection module produces a negative cable detection output in response to detecting the second signal, and wherein the detection module produces a positive cable detection output in response to detecting a signal other than the second signal.

The cable connector may be any available type or style, and may have any standard or non-standard pinout (i.e., the association between the location and function of each pin). The cable connector may have multiple pins for communicating multiple signals between the first device and the second device. As one non-limiting example, the cable connector may be a D-subminiature connector. Typically, the cable connector on the first and second device will be a socket part while the mating cable connector on each end of the cable will be a plug part, but the variations are still within the scope of the invention. Furthermore, both the socket and the plug may be referred to as having "pins" and may be described by the same "pinout".

The first device and the second device may be any two devices that need to be connected by a cable. A non-limiting list of potential devices includes compute nodes, switches, peripherals, storage controllers, and storage area networks. In one specific example, the first and second devices are both compute nodes. As long as the I/O for the relevant pin of the second device is not an open collector, then the connection between the first and second device can be detected at any time.

The second signal output by the signal generator for the purpose of cable detection should have a frequency that does not match the normal operating frequency of the IO device, and is preferably at least four times greater than the frequency of the first signal, which is used for a particular function. As a first non-limiting example, the first signal may be a 1 Khz frequency communication signal and the second signal may be a 10 KHz frequency signal as we depicted in our figures. An alternative example may involve using a first signal of 100 KHz and a second signal of 400 KHz. Other frequencies could be used. Frequency limitations would be dependant only upon the implementation of the detection circuit.

In a further embodiment, the signal generator includes a resistor having an impedance that is greater than an impedance of a driver of the second device that drives the first signal onto the input-only pin when a cable connects the second device to the cable connector on the first device. This difference in impedance allows the drivers of the second device to generate a signal that will over-ride the signal from the signal generator. Accordingly, when the cable is connected, the primary signal received at the detection module is the first signal from the second device rather than the signal from the signal generator. In one non-limiting example, the input-only pin may have an impedance of less than 1K ohm, and the signal generator has a resistor with an impedance between 1M ohm and 10M ohm. The IO impedance of the normal communication path needs to be lower than the impedance of the signal generator on the detection circuit, most preferably about 10 times lower.

The detection module may be a separate circuit or a function of a baseboard management controller. If the detection module is a separate circuit or device, the cable detection output of the detection module may be in direct communication with a baseboard management module of the first device. Preferably, the detection module will perform an averaging function to avoid a false positive cable detection output. The detection module may, for example, be a logic circuit, programmable logic device, field programmable gate array (FPGA), or other circuit. The detection module needs to be able to detect the frequency of the signal received and then determine whether the frequency detected indicates the presence of the cable. One example of the detection module may be implemented in VHDL ((VHSIC) Hardware Description Language; where VHSIC stands for Very-High-Speed Integrated Circuit) in an FPGA.

Another embodiment of the present invention provides a method of detecting a cable connected to a first device. The method comprises generating a second signal within the first device, and outputting the second signal onto an input-only pin of a cable connector on the first device, wherein the input-only pin is assigned to receive a first signal from a driver on a second device when a cable is connected from the second device to the cable connector, and wherein the second signal has a frequency that is at least four times greater than the frequency of the first signal. The method further comprises determining that a cable is not connected to the cable connector in response to detecting the second signal on a wire coupled to the input-only pin, and determining that the cable is connected to the cable connector in response to detecting a signal other than the second signal.

Embodiments of the foregoing method may further include generating a negative cable detection output signal in response to determining that the cable is not connected to the cable connector, and generating a positive cable detection output signal in response to determining that the cable is connected to the cable connector. Optionally, the method may include averaging the signal on the input-only pin to avoid a false positive cable detection output.

In still further embodiments of the method, the steps of determining that a cable is not connected to the cable connector and determining that the cable is connected to the cable connector are performed by a baseboard management module. Alternatively, the steps of determining that a cable is not connected to the cable connector and determining that the cable is connected to the cable connector is performed by a detection module, wherein the detection module provides a cable detection output to a baseboard management module.

It should be appreciated that certain embodiments of the invention provide the benefit of detecting a cable connection without requiring a dedicated pin. Rather, the invention can perform cable detection using an existing pin that is dedicated or assigned to some other function.

Embodiments of the cable detection apparatus utilize an "input only" pin on the first device. Accordingly, only the first device is able to detect a cable connection using that input-only pin. If a second device needs to be able to detect the cable connection, the second device would need to use a different pin that was "input only" as to the second device and include its own signal generator and detection circuit. Accordingly, the cable detection circuit would be duplicated in the reverse direction between the two boards using two different pins. Alternatively, the invention could be implemented utilizing a transmit pin as long as the relative impedances of the signal generator and transmit IO are managed.

FIG. 1 is a diagram of a system 10 including a first node 20 and a second node 40 prior to connecting a cable 12 between the two nodes. The first node 20 includes a processor 22 coupled to an input output module (I/O) 24, such as a network interface card. The I/O module 24 is in communication with an external cable connector 26 for connecting to the second node 40 via a cable 12. The second node 40 also includes a processor 42 coupled to an input output module (I/O) 44, such as a network interface card, that is in communication with an external cable connector 46 for connecting to the first node 20 via the cable 12. The pinout should be the same for each cable connector 26, 46 on the nodes 20, 40 and the each mating connector 14, 16 on the cable 12. Accordingly, representative pins 1-6 on the cable connector 26 will be connected to representative pins 1-6 on the cable connector 46 when the cable 12 is connected there between.

The first node 20 includes a cable detection circuit 30 that uses pin 1 to detect the presence of the cable 12 despite the fact that pin 1 has been assigned a separate communication function. For example, pin 1 in an input-only pin that provides input to the I/O 24. Specifically, the I/O 44 on the second node 40 includes a driver 48 for driving a signal onto pin 1 at the cable connector 46. However, since the cable 12 is not connected between the two cable connectors 26, 46, any output from the driver 48 cannot reach the first node 20.

The cable detection circuit 30 includes a signal generator 32 that outputs a signal onto a conductor wire 27 from pin 1 to the I/O module 24. The signal generator 32 includes a signal function generator 33, a diode 34, and a resistor 35. The signal function generator 33 is a logic circuit that provides a repeating wave form with a high impedance, such as a square wave at a uniform frequency. The detection module 36 is also coupled to the conductor wire 27, such that the detection module 36 detects whatever signal is on pin 1. The detection of a cable connection is discussed further in reference to FIG. 2 below, but the detection module 36 is shown in communication with a baseboard management controller (BMC) 28. The BMC can make various uses of the cable detection signal that indicates whether or not the cable 12 has been connected between the first and second nodes 20, 40. For example, the BMC 28 may inform a thread running in the processor 22 whether it can initiate network communications with the second node 40.

Figure 2:
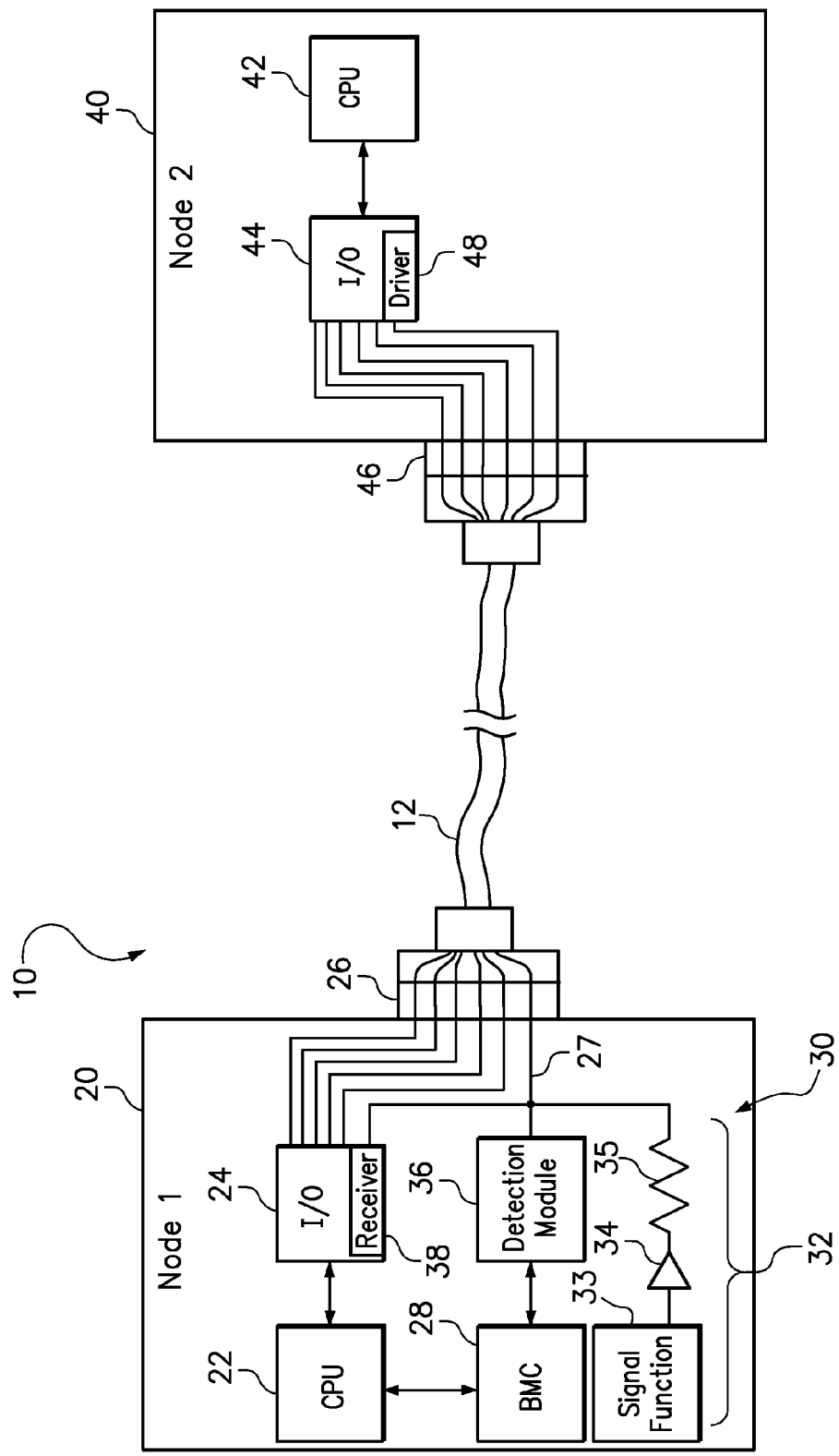
FIG. 2 is a diagram of a cable detection circuit after connecting a cable between two nodes

FIG. 2 is a diagram of the system 10 after connecting the cable 12 between the cable connector 26 of first node 20 and the cable connector 46 of second node 40. Accordingly, the signal output from the driver 48 is communicated to pin 1 and the conductor wire 27 that leads from pin 1 to a receiver 38 on the I/O module 24. Furthermore, the signal output from the driver 48 is also now detectable by the detection module 36. It should be understood that the signal generator 32 continues to drive its own signal onto pin 1. However, the signal generator 32 has a high impedance resistor 35 in-line, such that if second node 40 is connected by the cable 12 then the signal from the driver 48 overrides the signal being driven by the signal generator 32. If the detection module 36 detects a signal frequency consistent with the output of the signal generator 32 on the first node 20, then it is determined that a cable is not connected. If the detection module 36 detects a signal frequency consistent with the output of the driver 48 of the second node 40, then it is determined that a cable is connected. A cable detection signal that indicates the cable 12 has been connected between the first and second nodes 20, 40 may be provided to the BMC 28.

Figure 3:
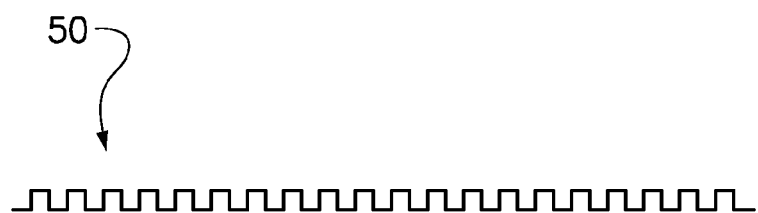
FIG. 3 is a diagram of a signal generated by the cable detection circuit.

FIG. 3 is a diagram of a signal 50 generated by the signal generator (see signal generator 32 of FIG. 1) and output to pin 1 (see FIGS. 1-2). The frequency of this signal should be at least four times the frequency of the signal from the driver on a second device, which makes the two signals easier to distinguish.

Figure 4:
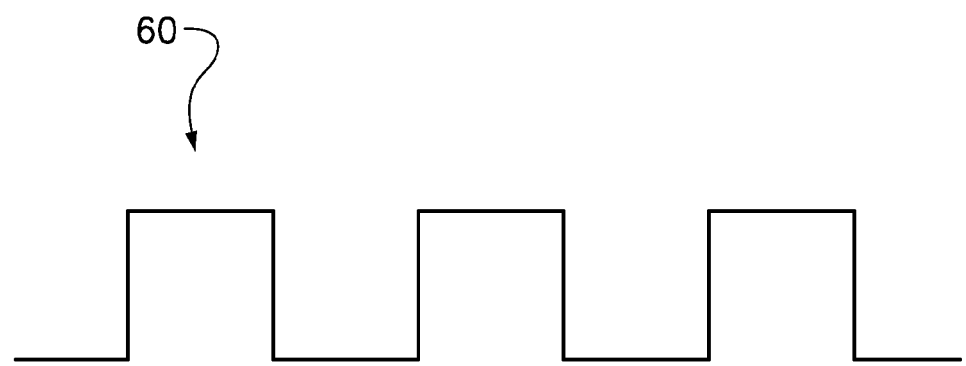
FIG. 4 is a diagram of a signal driven over a wire of the cable from one node to another.

FIG. 4 is a diagram of a signal 60 driven over a wire of the cable 12 from the second node to the first node. Comparing the signals 50, 60 in FIGS. 3 and 4, it can be seen that the signal 50 has a frequency that is at least four times the frequency of the signal 60 from the driver on a second device.

Figure 5:
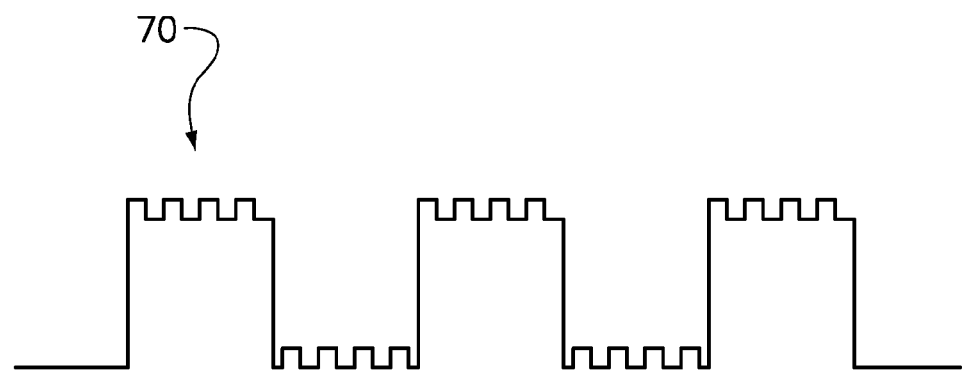
FIG. 5 is a diagram of a composite signal including the signal generated by the cable detection circuit (per FIG. 3) superimposed on the signal driven over a wire of the cable from one node to another (per FIG. 4).

FIG. 5 is a diagram of a composite signal 70 including the signal 50 generated by the cable detection circuit (per FIG. 3) superimposed on the signal 60 driven over a wire of the cable from one node to another (per FIG. 4). For example, the first signal 60 may be a 100 KHz signal and the second signal may be a 400 KHz signal. As shown, the 400 KHz signal is essentially just noise when the 100 KHz signal is present.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention may be described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of detecting a cable connected to a first device, comprising:
   generating a second signal within the first device;
   outputting the second signal onto an input-only pin of a cable connector on the first device, wherein the input-only pin is assigned to receive a first signal from a driver on a second device when a cable is connected from the second device to the cable connector, and wherein the second signal has a frequency that is at least four times greater than the frequency of the first signal;
   determining that a cable is not connected to the cable connector in response to detecting the second signal on a wire connected to the input-only pin; and
   determining that the cable is connected to the cable connector in response to detecting a signal other than the second signal.

2. The method of claim 1, further comprising:
   generating a negative cable detection output signal in response to determining that the cable is not connected to the cable connector; and
   generating a positive cable detection output signal in response to determining that the cable is connected to the cable connector.

3. The method of claim 1, wherein the cable connector has multiple pins for communicating multiple signals between the first device and the second device.

4. The method of claim 1, wherein the first device and the second device are compute nodes.

5. The method of claim 1, wherein the input-only pin has an impedance less than 1 K ohm.

6. The method of claim 1, wherein the second signal is generated by a signal generator including a resistor that has an impedance between 1 M ohm and 10 M ohm.

7. The method of claim 1, wherein the second signal is generated by a signal generator including a resistor that has an impedance that is greater than an impedance of a driver of the second device that drives the first signal onto the input-only pin when a cable connects the second device to the cable connector on the first device.

8. The method of claim 1, further comprising:
   averaging the signal on the input-only pin to avoid a false positive cable detection output.

9. The method of claim 1, wherein determining that a cable is not connected to the cable connector and determining that the cable is connected to the cable connector is performed by a baseboard management module.

10. The method of claim 2, wherein determining that a cable is not connected to the cable connector and determining that the cable is connected to the cable connector is performed by a detection module; and
    the detection module providing a cable detection output to a baseboard management module.

* * * * *